(12) United States Patent
Larsson et al.

(10) Patent No.: US 10,023,066 B2
(45) Date of Patent: Jul. 17, 2018

(54) METHOD AND APPARATUS FOR DETERMINING THE STATUS OF A BATTERY IN A VEHICLE

(71) Applicant: VOLVO CAR CORPORATION, Gothenburg (SE)

(72) Inventors: Torbjorn Larsson, Alingsas (SE); Alexander Engstrom, Gothenburg (SE); Linus Franzen, Gothenburg (SE); Mats Thorngren, Gothenburg (SE); Fabian Fogelberg, Stora Hoga (SE); Pelle Thorson, Ucklum (SE); Petter Almhagen, Partille (SE); Emil Wall, Partille (SE); Daniel Midholm, Vastra Frolunda (SE)

(73) Assignee: Volvo Car Corporation, Gothenburg (SE)

( * ) Notice: Subject to any disclaimer, the term of this patent is extended or adjusted under 35 U.S.C. 154(b) by 19 days.

(21) Appl. No.: 15/262,455

(22) Filed: Sep. 12, 2016

(65) Prior Publication Data
US 2017/0080819 A1    Mar. 23, 2017

(30) Foreign Application Priority Data
Sep. 17, 2015    (EP) .................................... 15185633

(51) Int. Cl.
*B60L 11/18*    (2006.01)
*B60W 20/13*    (2016.01)
*G01R 31/36*    (2006.01)

(52) U.S. Cl.
CPC .......... *B60L 11/1861* (2013.01); *B60W 20/13* (2016.01); *G01R 31/3634* (2013.01); *G01R 31/3648* (2013.01); *G01R 31/3679* (2013.01); *G01R 31/3689* (2013.01); *Y10S 903/904* (2013.01)

(58) Field of Classification Search
CPC ......................... B60L 11/1861; H01M 10/486
See application file for complete search history.

(56) References Cited

U.S. PATENT DOCUMENTS

| 6,424,158 B2 | 7/2002 | Klang |
| 2010/0019727 A1 | 1/2010 | Karden et al. |
| 2012/0256599 A1 | 10/2012 | Gu |
| 2013/0325379 A1 | 12/2013 | Nakamura |

OTHER PUBLICATIONS

Extended European Search Report from priority European application No. EP15185633, dated Mar. 14, 2016, 3 pp.

*Primary Examiner* — Michael D Lang
(74) *Attorney, Agent, or Firm* — Brooks Kushman P.C.

(57) ABSTRACT

A method for determining a status of a vehicle battery includes determining an initial temperature and an initial state of charge of the battery, determining a current threshold value based on the initial temperature and the initial state of charge of the battery, starting the vehicle engine, charging the battery for a predetermined charging period $t_1$, measuring two charging currents, $I_1$ and $I_2$, to the battery at two predetermined points in time during the charging period $t_1$, determining an expected current value at a time $t_3=t_1+t_2$ based on the measured charging currents, comparing the expected current value with the current threshold value, and determining the battery is faulty if the expected current value is lower than the current threshold value.

17 Claims, 4 Drawing Sheets

METHOD AND APPARATUS FOR DETERMINING THE STATUS OF A BATTERY IN A VEHICLE

CROSS-REFERENCE TO RELATED APPLICATIONS

This application claims foreign priority benefits under 35 U.S.C. § 119(a)-(d) to European patent application number EP 15185633.3, filed Sep. 17, 2015, which is incorporated by reference in its entirety.

TECHNICAL FIELD

The present disclosure relates to a method and a device for determining the status of a battery in a vehicle.

BACKGROUND 12V batteries have historically always been subject to frequent replacements connected to warranty claims, thus leading to very high costs. There are several different reasons to why batteries are replaced before the warranty period has passed. One of the main reasons for these replacements is due to inaccurate judgements by the battery testing methods used in workshops.

Constructing a battery test that is both quick and can be performed without removing the battery from the vehicle is difficult. Accurate battery testing methods typically takes days and requires large testing equipment, which is both expensive and stationary. A handheld battery tester commonly used to determine the health of a battery connected to the warranty claim utilizes high frequency and low voltage to calculate the impedance of the battery. The impedance can in turn, to some extent, be used to determine the health of the battery. However, due to the fact that the handheld tester cannot discharge or charge the battery, nor does it take temperature or state-of-charge into account, making it less reliable.

A more thorough lab-based evaluation of batteries which had been discarded by a conventional handheld tester showed that a large portion of the batteries were only low on charge and still had more than enough capacity to continue service.

Accordingly, it is desirable to provide an improved method for determining the status of a battery in a vehicle to avoid discarding functioning batteries before the actual end-of-life of the battery.

U.S. Pat. No. 6,424,158 discloses a method and system for performing automatic and rapid diagnostic testing and charging of a battery utilizing a charger combined with a rapidly variable load. The method involves measuring currents at different voltage levels. However, the results from the disclosed battery tester are still not sufficiently accurate.

SUMMARY

In view of above-mentioned and other drawbacks of the prior art, it is an object of the present disclosure to provide an improved method and system for determining the status of a battery in order to reduce the amount of batteries which are erroneously discarded.

According to a first embodiment of the disclosure, there is provided a method for determining a status of a battery in a vehicle, the method comprising; determining an initial temperature and an initial state of charge of the battery; controlling that the initial state of charge, SoC, does not exceed a predetermined threshold value and that the initial temperature, T, is not below a predetermined threshold value; calculating a current threshold value based on the initial temperature and the initial state of charge of the battery; starting an engine of the vehicle; charging the battery for a predetermined charging period $t_1$; measuring two charging currents $I_1$ and $I_2$ to the battery at two predetermined points in time during the charging period $t_1$; based on the measured charging currents, determining an expected current value at a time $t_3 = t_1 + t_2$; comparing the expected current value with the current threshold value; and if the expected current value is lower than the current threshold value, determining that the battery is faulty.

The present disclosure is based on the realization that the status of a battery, i.e. whether the battery is healthy or not, can be determined with high accuracy using a method where the initial state of charge and temperature of the battery is taken into account when calculating an acceptable threshold current after a certain predetermined charging cycle. Thereby, a quick and reliable method is provided which does not require the battery to be removed from the vehicle. For a specific battery type, it is assumed the relation between SoC, T and a threshold current is known, as will be discussed in further detail below.

Modern batteries are commonly equipped with a so called Battery Monitor Sensor (BMS) which continuously monitors the battery's voltage, current and temperature. The BMS can also determine the SoC of the battery, for example through integration of the current from the battery during operation of the vehicle. By using the information available from the BMS a more accurate method for determining the status of a battery in a vehicle can be utilized also in a workshop environment where complicated and time consuming tests cannot be performed for practical reasons. Thereby, fewer batteries are erroneously discarded, in comparison with previous methods where it was common to err on the side of caution when determining whether a battery should be replaced or not. A battery can be considered to be faulty for example if it is unable to deliver a sufficiently high current during a starting phase of the engine or if the energy content is too low to support the required functions when the vehicle is running. A battery which is considered to be healthy should be able to perform satisfactorily for at least a year, and more preferably for up to five years.

In principle, the method according to various embodiments of the disclosure can be used in any vehicle comprising a means for charging the battery. Most commonly, the method is intended for use with 12V and 24V batteries in conventional vehicles comprising a combustion engine capable of charging the battery.

According to one embodiment of the disclosure, the method may further comprise, if the expected current value is higher than the current threshold value, turning off the engine; creating a constant current load using vehicle electrical system loads for the battery for a predetermined period $t_4$, measuring the battery voltage after the period $t_4$; comparing the measured battery voltage to a predetermined voltage threshold value; and determining that the battery is faulty if the measured battery voltage is lower than the voltage threshold value. In addition to being able to provide a sufficient current after charging, the battery should also be able to provide a sufficient voltage when the battery is subjected to a load. Thereby, if the battery passes the first phase where the battery is charged, a second test phase is performed where the battery is submitted to a load, and thereby being discharged, after which the resulting voltage is measured to ensure that the battery is capable of providing the required voltage. Accordingly, if the battery passes the first phase of the method, which may be referred to as a charging phase, and the following phase which may be referred to as a discharging phase, the battery is considered to be healthy.

In one embodiment of the disclosure, the initial state of charge threshold value may advantageously be lower than or equal to 70%. If the state of charge is higher than approximately 70%, it may be more difficult for the battery to receive charge, making the charging phase of the test unreliable. Therefore, it is ensured that the state of charge is not above 70% before the test is initiated. If the state of charge is determined to be too high, loads may be applied to the battery until the state of charge has decreased to 70% or below.

According to one embodiment of the disclosure, the initial battery temperature threshold value may advantageously be larger than or equal to 0° C. For low battery temperatures, below 0° C., the battery may have difficulties both with receiving charge as well as with keeping a steady voltage when a load is applied and a current is drawn from the battery. Therefore, if the temperature of the battery is too low, the test is not initiated. The battery may thus be warmed to enable the test to begin.

In one embodiment of the disclosure, the charging current $I_1$ may be measured at $t_1-10$ s and the charging current $I_2$ may be measured at $t_1$. Thereby, two charging currents are measured with a fixed time period in between the two measurements, enabling a determination of an expected current value at a time $t_3$. Moreover, $t_1$ may for example be 2 min±10% and $t_2$ may be 1 min±10%. It should be noted that the above time periods are examples, and that it is entirely possible to perform the method using other times, provided that the other parameters of the method are adjusted accordingly.

According to one embodiment of the disclosure, the expected current value may advantageously be calculated by means of extrapolation.

In one embodiment of the disclosure, the current threshold value $I_{th}$ is calculated as $I_{th}(SoC,T)=p_1+p_2SoC+p_3T+p_4SoCT+p_5T^2+p_6SoCT^2+p_7T^3$, where $p_1$-$p_7$ are empirically determined parameters. The parameters $p_1$-$p_7$ are used to calculate an expected current value after a predetermined charging phase has been performed for a specific type of battery and for a given initial state of charge and temperature. The parameters for a specific battery type can for example be derived in a lab environment where more rigorous testing can be performed.

According to one embodiment of the disclosure, the step of charging the battery is performed using an alternator of said vehicle. Thereby, the method can be performed without the need for additional power sources external to the vehicle. Alternatively, a DC/DC charger may also be used.

According to one embodiment of the disclosure, the current load for the battery may advantageously be 20 A±10%. The current load should be constant and sufficiently high so that the battery is being discharged to a measurable degree during the discharge phase when the current load is applied and when alternator is disconnected from the battery.

According to one embodiment of the disclosure, $t_4$ is 4 min±10%, and the predetermined voltage threshold value is 11V. It has been determined, for a typical 12V battery, that a battery voltage higher than or equal to 11V after a discharge phase of approximately 4 min is indicative of a healthy battery.

According to a second embodiment of the disclosure, there is provided a battery tester comprising: a communication interface configured to be connected to a communication interface of a vehicle; a control unit configured to communicate with a vehicle to: determine an initial temperature and an initial state of charge of the battery; control that the initial state of charge does not exceed a predetermined threshold value and that the initial temperature is not below a predetermined threshold value; start an engine of the vehicle; charge the battery for a predetermined charging time $t_1$; measure two charging currents $I_1$ and $I_2$ to the battery at two predetermined points in time during the charging time based on the measured charging currents, determine an expected current value at a time $t_3=t_1+t_2$, determine a current threshold value based on the initial temperature and the initial state of charge of the battery; compare the expected current value with the current threshold value; and if the expected current value is lower than the current threshold value, provide an indication that the battery is faulty.

According to one embodiment of the disclosure the battery tester is further configured to, if the expected current value is higher than the current threshold value, turn off the engine; create a constant current load using vehicle electrical system loads for the battery for a predetermined period $t_4$, measure the battery voltage after the period $t_4$; compare the measured battery voltage to a predetermined voltage threshold value; and if the measured battery voltage is lower than the voltage threshold value, provide an indication that the battery is faulty.

Battery testers commonly used in workshops do not have the ability to charge or to discharge the battery. Nor do they take the state of charge or the temperature into account when doing the test, even though they are parameters which affect the battery performance to a large degree. Thereby, the above described battery tester provides a more accurate determination of the status of the battery, which in the end leads to substantial economical and environmental advantages since fewer healthy batteries are discarded.

Effects and features of the second embodiment of the disclosure are largely analogous to those described above in connection with the first embodiment of the disclosure.

Further features of, and advantages with, the present disclosure will become apparent when studying the appended claims and the following description. The skilled person realize that different features of the present disclosure may be combined to create embodiments other than those described in the following, without departing from the scope of the present disclosure.

BRIEF DESCRIPTION OF THE DRAWINGS

The present disclosure will now be described in more detail, with reference to the appended drawings showing an example embodiment of the disclosure, wherein.

DETAILED DESCRIPTION

As required, detailed embodiments are disclosed herein. However, it is to be understood that the disclosed embodiments are merely exemplary and that various alternative forms may be employed. The figures are not necessarily to scale. Some features may be exaggerated or minimized to show details of particular components. Therefore, specific structural and functional details disclosed herein are not to be interpreted as limiting, but merely as a representative basis for teaching one skilled in the art.

In the present detailed description, various embodiments of the method according to the present disclosure are mainly described with reference to a 12 V battery in a vehicle comprising a combustion engine and an alternator for charging the battery. However, the method is equally applicable to other types of batteries such as a 24 V battery, and other means of charging the battery may be also utilized.

Figure 1:
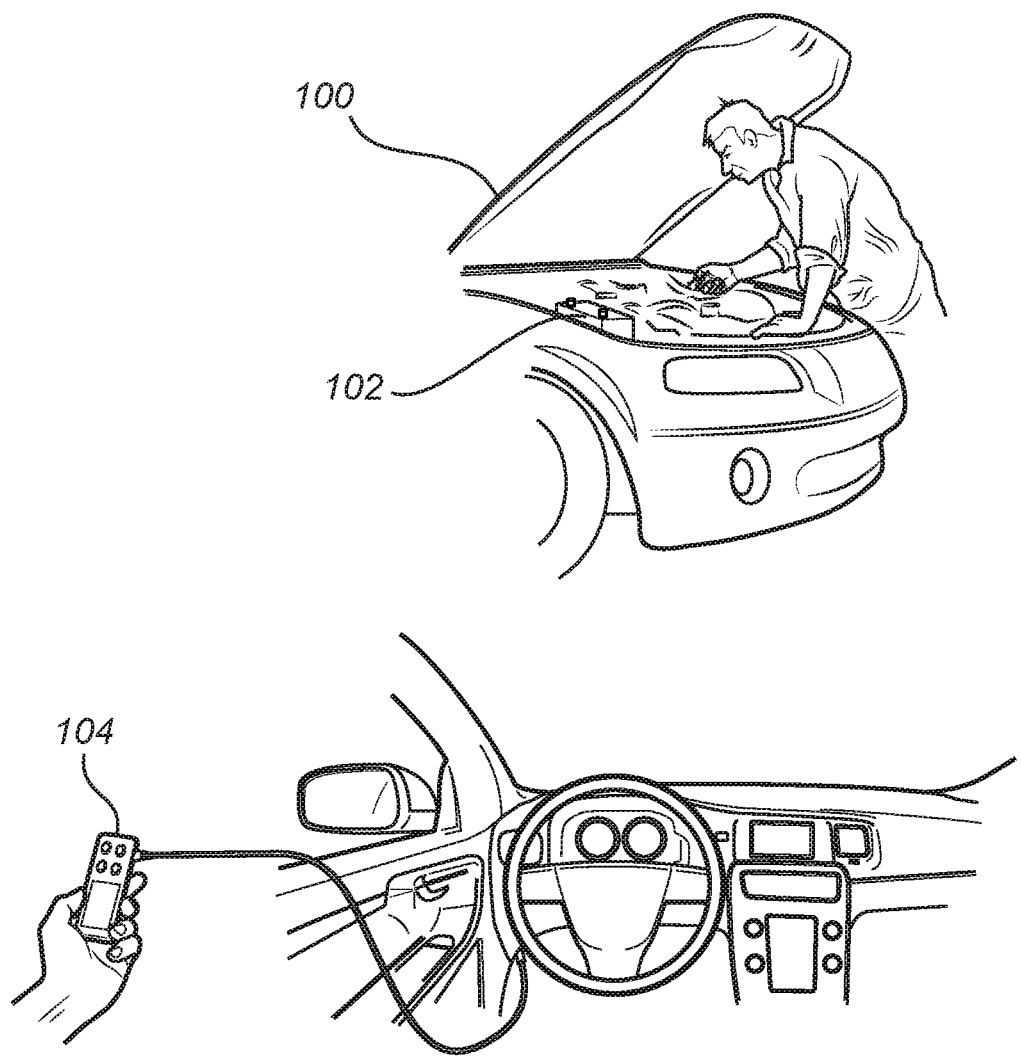
FIG. 1 schematically illustrates a vehicle comprising a battery which may be tested by a method according to an embodiment of the disclosure.

FIG. 1 is a schematic illustration of a vehicle 100 comprising a 12V battery 102 which may be tested according to an embodiment of the disclosure. The test is here illustrated as being performed by a battery tester 104 connected to a communication interface of the vehicle so that the battery tester 104 can read information from a battery monitor sensor (BMS) of the battery. It should be noted that the vehicle 100, vehicle communication interface, battery tester 104, battery tester communication interface, control unit, battery monitor sensor any other system, subsystem, device or module described herein may individually, collectively, or in any combination comprise appropriate circuitry and/or one or more appropriately programmed processors (e.g., one or more microprocessors including central processing units (CPU)) and associated memory, which may include stored operating system software and/or application software executable by the processor(s) for controlling operation thereof and for performing the particular algorithms represented by the various functions and/or operations described herein, including interaction between and/or cooperation with each other. One or more of such processors, as well as other circuitry and/or hardware may be included in a single ASIC (Application-Specific Integrated Circuitry), or several processors and various circuitry and/or hardware may be distributed among several separate components, whether individually packaged or assembled into a SoC (System-on-a-Chip). In that regard, as depicted in FIG. 2, the communication interfaces of the vehicle 100 and/or battery tester 104 may comprise a wired connection, or alternatively may comprise a wireless connection. Such communication interfaces may also comprise appropriate circuitry for communication between the vehicle 100 and the battery tester 104, such as transmitters and receivers, and may facilitate and/or enable communicate according to any communications and/or messaging protocol known in the art.

Figure 2A:
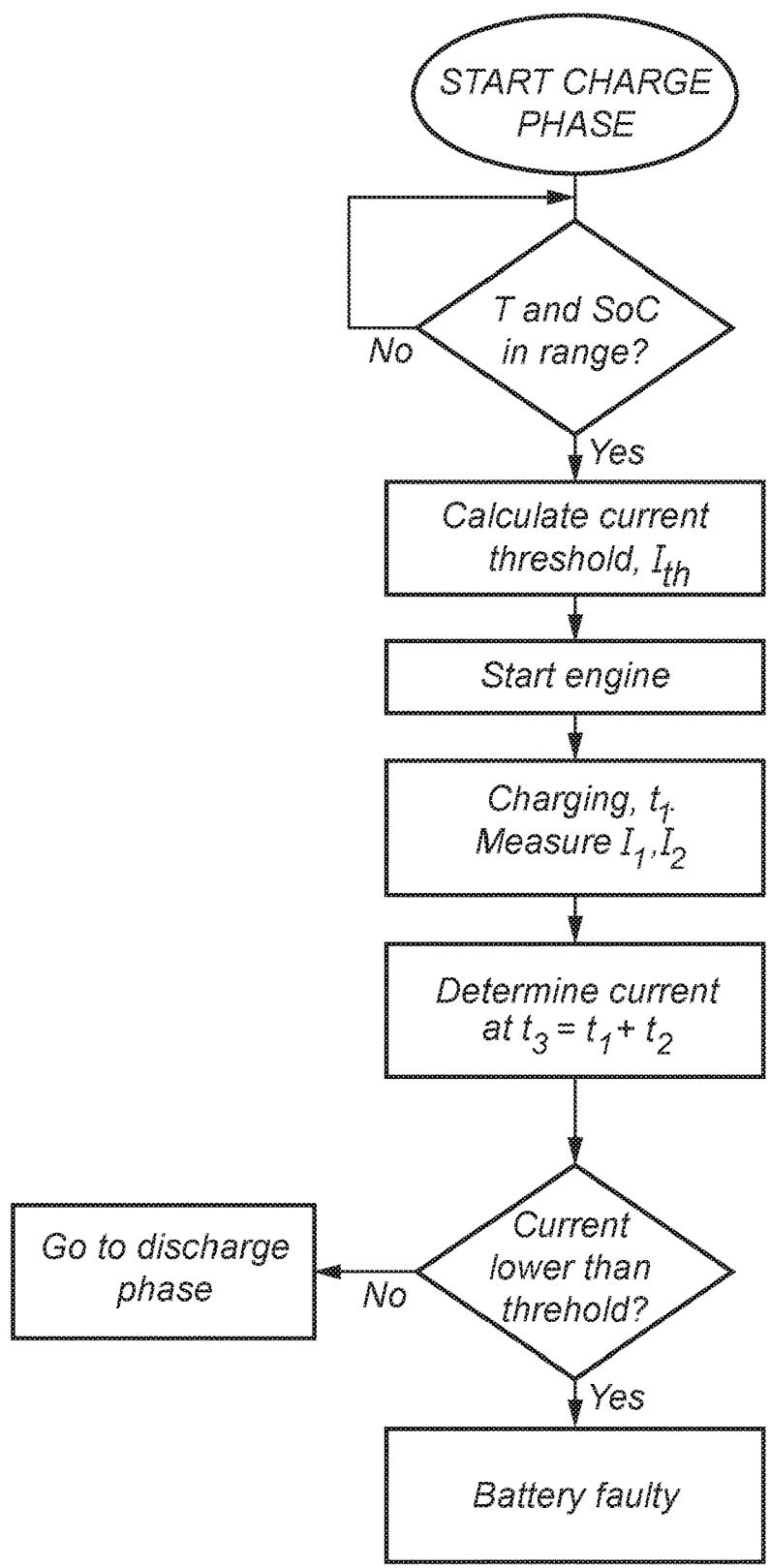
FIGS. 2A-B are flow charts outlining the general steps of a method according to embodiments of the disclosure.
Figure 2B:
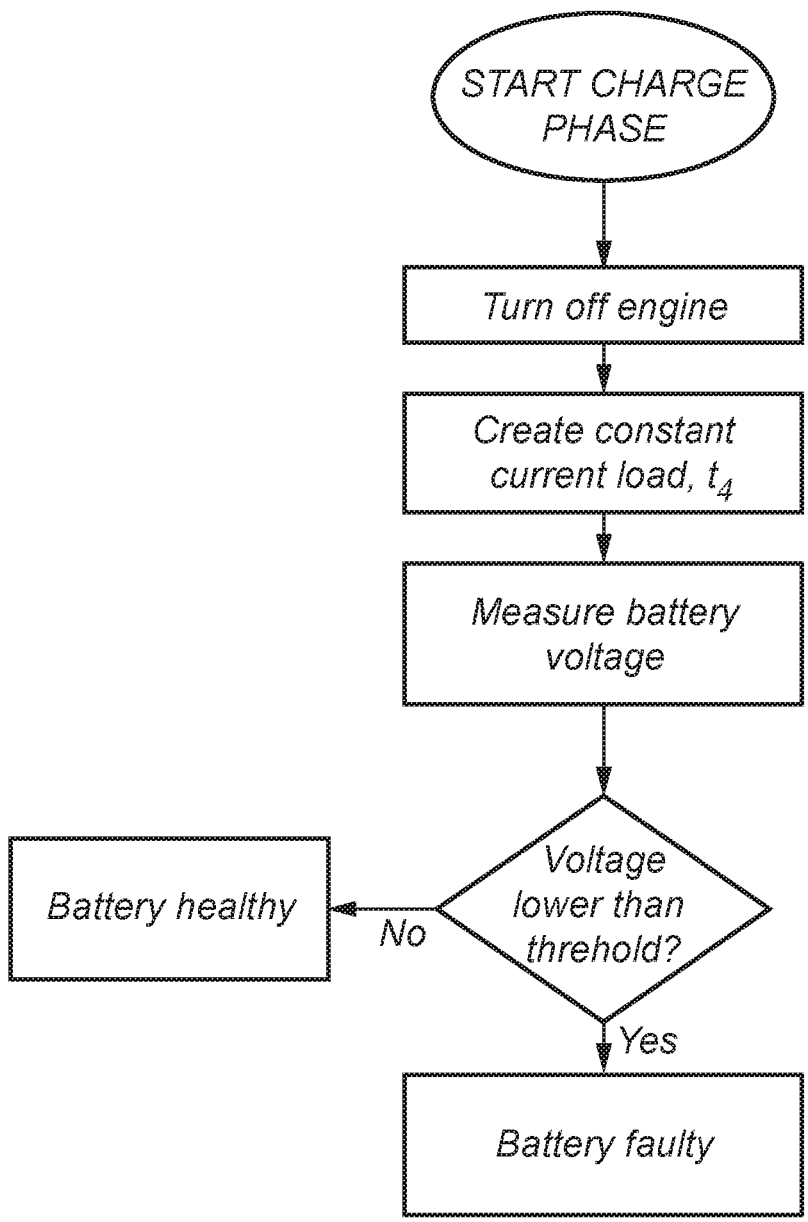

FIG. 2A is a flow chart outlining the general steps of a method according to an embodiment of the disclosure. The method will be described with reference to the flow chart in FIG. 2A and the graph in FIG. 3. Moreover, it is to be understood that the method can be performed by the battery tester 104 which is specifically configured to perform a battery test according to the described method.

To start the charging phase, the initial temperature and state of charge of the battery is determined by reading the information from the BMS. If the temperature is higher than or equal to 0° C. and the state of charge is equal to or lower than 70% the test can be initiated. If the temperature is below 0° C. the battery can be heated, for example by keeping it indoors in room temperature until the temperature has increased sufficiently. Similarly, if the state of charge is above 70%, a load can be applied so that the state of charge is decreased.

Once it is established that the temperature and state of charge is within the acceptable ranges, the current threshold value is calculated using the relation $I_{th}(SoC,T) = p_1 + p_2 SoC + p_3 T + p_4 SoCT + p_5 T^2 + p_6 SoCT^2 + p_7 T^3$.

For an exemplary 12V battery, the parameters $p_1$ to $p_7$ can be determined empirically through a more thorough analysis of a number of used batteries. For example, batteries which have been previously discarded using a simplified status test may be used. Each battery is subjected to a standardized capacity test for lead-acid batteries to determine the battery status as a percentage of the nominal capacity of the battery. The battery status was compared with a threshold value, and the batteries having a capacity exceeding the threshold value were subjected to further analysis. The threshold value can be somewhat arbitrarily set depending on the requirements that a manufacturer want to set for a battery. For example, depending on if the requirement is that the battery should have an estimated remaining life length of one year or five years, the threshold value will be set differently.

The batteries passing the capacity test were subsequently subjected to a number of test cycles where each battery was set to a number of SoC levels, here ranging from 20% to 70%. For each SoC level, each battery was set to a number of temperatures, here in the range of 0° C. to 25° C., and for each SoC level and temperature combination a charge acceptance test was performed at a fixed charging voltage to determine the resulting charging current after a predetermined charging time, corresponding to the time $t_3$. Thereby, an acceptable charging current at the time $t_3$ was determined for a number of initial combinations of SoC and temperature, making it possible to derive a function describing an acceptable charging current for any combination of SoC and temperature within the given intervals. The resulting function for determining the current threshold value as a function of SoC and T, $I_{th}(SoC,T) = p_1 + p_2 SoC + p_3 T + p_4 SoCT + p_5 T^2 + p_6 SoCT^2 + p7T^3$, can thus be defined by the parameters $p_1$ to $p_7$ as described above.

Figure 3:
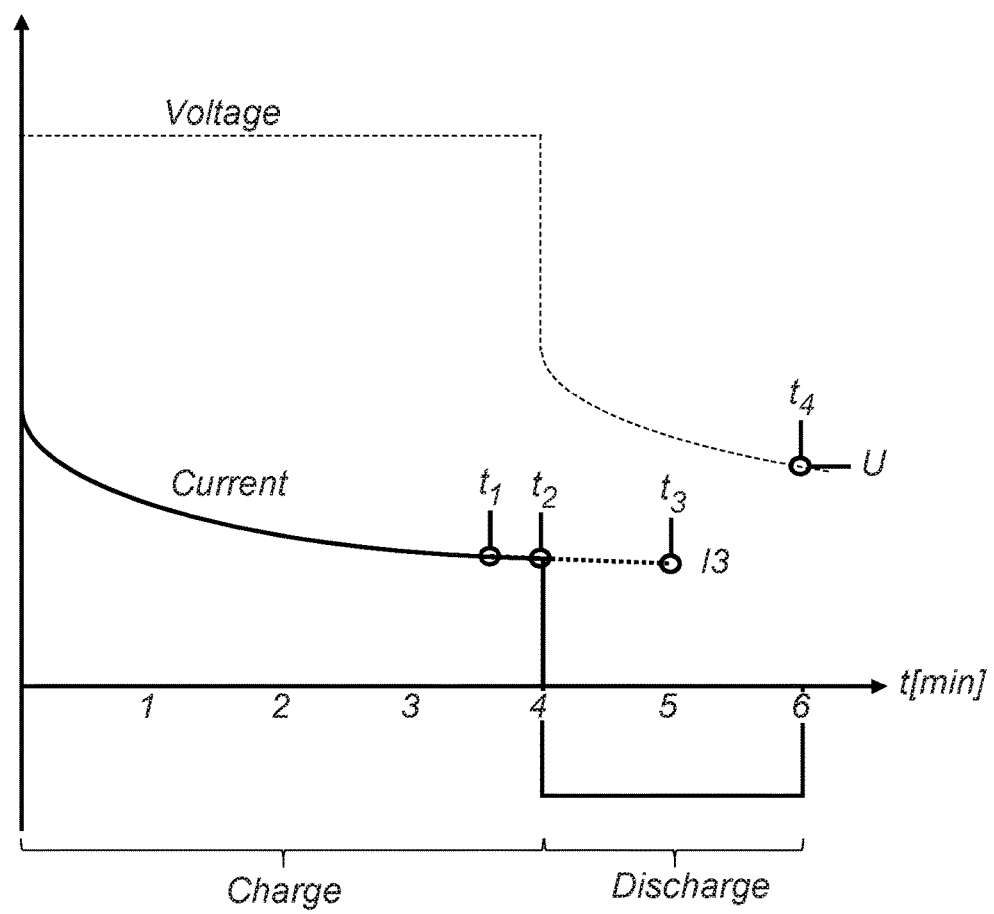
FIG. 3 is a graph outlining features of the method according to an embodiment of the disclosure.

Once the threshold current has been determined the engine is started. If the battery is discharged to the degree that it is not possible to start the engine, a starting aid may be employed to start the engine. The battery is then charged for a period $t_1$, which for example may be 2 min, by applying a fixed voltage supplied by the alternator over the battery. During charging, the charging current is measured at two points in time to give the currents $I_1$ and $I_2$. In the present example, $I_1$ is measured at 1 min 50 s and $I_2$ is measured at 2 min. From the two currents $I_1$ and $I_2$, an expected current value at a time $t_3$ is extrapolated as illustrated in FIG. 3. In FIG. 3, the extrapolation is illustrated as a linear extrapolation. However, it would also be possible to extrapolate using an exponential function, which would further reduce the time needed for charging the battery.

Next, the expected current value is compared with the threshold current $I_{th}$, and if the expected current value is lower than the threshold current the battery is considered to be faulty and in need of replacement.

If the expected current on the other hand is higher than the threshold current, a discharging test is performed to ensure that the battery maintains an acceptable voltage after a discharging phase. The method of discharging the battery is outlined in flow chart of FIG. 2B and in the graph shown in FIG. 3.

To start the discharging phase, the engine is turned off and the alternator thus stops charging of the battery. Next, a constant current load is applied to the battery. For practical reasons, there is often a current load also during charging, since the vehicle is turned on and the engine is running, which implies that certain electrical systems of the vehicle are active. Such loads may include various CPUs and communications equipment of the vehicle, lights etc. Therefore, during a test, it may be appropriate to verify that the correct load for the discharge phase is set already prior to starting the charging phase. A difference between the charge and discharge phase is that the alternator is being disconnected from the battery during the discharge phase. To ensure an appropriate load, the following setting may for example be employed:

Climate system: Auto, 22° C.
Light: Auto/half light
Chair climate: off
Defroster: off
Infotainment: off In the case where loads are applied also during the charging phase, it is desirable that applications with high power consumption such as heating are disabled to ensure proper charging. The employment of appropriate loads may be controlled remotely by the battery tester, or they may be set manually by the workshop mechanic prior to initiation of the test procedure.

In the present example, the current load is approximately 20 A, and discharging is done for a predetermined period of time, here 4 min, after which the resulting battery voltage is measured.

Finally, the measured voltage is compared to a predetermined voltage threshold value, and if the measured voltage is higher than or equal to the threshold voltage, the battery is considered to be healthy. For the 12 V battery used in the present example, a voltage threshold value of 11 V is considered acceptable. Otherwise, the battery is considered to be faulty and the battery tester indicated that the battery needs to be replaced.

It should be noted that the threshold voltage is determined for a specific current load and for a specific discharging time, and that the threshold voltage may need to be adjusted if the battery type, specified current load or discharge time is changed.

Accordingly, for a battery to be determined to be healthy, it should pass both the charging test phase and the discharging test phase.

Even though the disclosure has been described with reference to specific exemplifying embodiments thereof, many different alterations, modifications and the like will become apparent for those skilled in the art. Also, it should be noted that steps of the method may be interchanged or arranged in various ways, the method yet being able to perform the functionality of the present disclosure.

Additionally, variations to the disclosed embodiments can be understood and effected by the skilled person in practicing the claimed disclosure, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage.

While exemplary embodiments are described above, it is not intended that these embodiments describe all possible forms of the disclosure. Rather, the words used in the specification are words of description rather than limitation, and it is understood that various changes may be made without departing from the spirit and scope of the disclosure. Additionally, the features of various implementing embodiments may be combined to form further embodiments of the disclosure.

What is claimed is:

1. A method for determining a status of a battery in a vehicle via a communication interface connectable to a communication interface of the vehicle and via a control unit configured to communicate with the vehicle, the method comprising:
   determining an initial temperature, T, and an initial state of charge, SoC, of the battery;
   determining a current threshold value, $I_{th}$, based on the initial temperature and the initial state of charge of the battery;
   starting an engine of the vehicle;
   charging the battery for a predetermined charging period $t_1$;
   measuring two charging currents $I_1$ and $I_2$ to the battery at two predetermined points in time during the charging period $t_1$;
   based on the measured charging currents, determining an expected current value at a time $t_3=t_1+t_2$;
   comparing the expected current value with the current threshold value; and
   if the expected current value is lower than the current threshold value, determining that the battery is faulty providing an indication of a faulty battery.

2. The method according to claim 1 further comprising controlling the initial battery temperature and the initial state of charge so that the initial battery temperature is not below a predetermined initial battery temperature threshold value and the initial state of charge does not exceed a predetermined initial state of charge threshold value.

3. The method according to claim 2 wherein the predetermined initial state of charge threshold value is lower than or equal to 70%.

4. The method according to claim 2 wherein the initial battery temperature threshold value is larger than or equal to 0° C.

5. The method according to claim 1 further comprising, if the expected current value is higher than the current threshold value,
   turning off the engine;
   creating a constant current load using vehicle electrical system loads for the battery for a predetermined period $t_4$;
   measuring a battery voltage after the period $t_4$;
   comparing the measured battery voltage to a predetermined voltage threshold value; and
   determining that the battery is faulty if the measured battery voltage is lower than the predetermined voltage threshold value.

6. The method according to claim 5 wherein the constant current load is 20 A±10%.

7. The method according to claim 5 wherein $t_4$ is 4 min±10%.

8. The method according to claim 5 wherein the predetermined voltage threshold value is 11V.

9. The method according to claim 1 wherein the charging current $I_1$ is measured at $t_1$-10s and the charging current $I_2$ is measured at $t_1$.

10. The method according to claim 1 wherein $t_1$ is 2 min±10%.

11. The method according to claim 1 wherein $t_2$ is 1 min±10%.

12. The method according to claim 1 wherein the expected current value is calculated by extrapolation.

13. The method according to claim 1 wherein the current threshold value is calculated as $I_{th}(SoC,T)=p_1+p_2SoC+p_3T+p_4SoCT+p_5T^2+p_6SoCT^2+p_7T^3$, where $p_1$-$p_7$ are empirically determined parameters.

14. The method according to claim 1 wherein the step of charging the battery is performed using an alternator of the vehicle.

15. A battery tester comprising:
a communication interface connectable to a communication interface of a vehicle; and
a control unit configured for communicating with the vehicle to:
determine an initial temperature and an initial state of charge of the battery;
start an engine of the vehicle;
charge the battery for a predetermined charging time $t_1$;
measure two charging currents $I_1$ and $I_2$ to the battery at two predetermined points in time during the charging time;
based on the measured charging currents, determine an expected current value at a time $t_3=t_1+t_2$;
determine a current threshold value based on the initial temperature and the initial state of charge of the battery;
compare the expected current value with the current threshold value; and
if the expected current value is lower than the current threshold value, provide an indication that the battery is faulty.

16. The battery tester according to claim 15 wherein, if the expected current value is higher than the current threshold value, the battery tester is configured to
turn off the engine;
create a constant current load using vehicle electrical system loads for the battery for a predetermined period $t_4$,
measure the battery voltage after the period $t_4$;
compare the measured battery voltage to a predetermined voltage threshold value; and
if the measured battery voltage is lower than the voltage threshold value, provide an indication that the battery is faulty.

17. The battery tester according to claim 15 further configured to control the initial state of charge and the initial battery temperature so that the initial state of charge does not exceed a predetermined initial sate of charge threshold value and the initial battery temperature is not below a predetermined initial battery temperature threshold value.

* * * * *